United States Patent
Lee et al.

(10) Patent No.: US 10,088,127 B2
(45) Date of Patent: Oct. 2, 2018

(54) MEMBER FOR CONTROLLING LUMINOUS FLUX, METHOD FOR FABRICATING THE MEMBER, AND DISPLAY DEVICE HAVING THE MEMBER

(71) Applicant: LG INNOTEK CO., LTD., Seoul (KR)

(72) Inventors: Gi Seok Lee, Seoul (KR); Eun Sung Seo, Seoul (KR); Hyun Ho Choi, Seoul (KR); Chang Hyuck Lee, Seoul (KR); Ki Cheol Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 835 days.

(21) Appl. No.: 14/404,503

(22) PCT Filed: Dec. 14, 2012

(86) PCT No.: PCT/KR2012/010937
§ 371 (c)(1),
(2) Date: Nov. 28, 2014

(87) PCT Pub. No.: WO2013/180365
PCT Pub. Date: Dec. 5, 2013

(65) Prior Publication Data
US 2016/0003450 A1    Jan. 7, 2016

(30) Foreign Application Priority Data

May 31, 2012 (KR) .......................... 10-2012-0058852
May 31, 2012 (KR) .......................... 10-2012-0058857

(51) Int. Cl.
*F21V 7/00* (2006.01)
*F21V 13/04* (2006.01)
(Continued)

(52) U.S. Cl.
CPC ................ *F21V 13/04* (2013.01); *F21K 9/64* (2016.08); *F21V 5/002* (2013.01); *F21V 5/008* (2013.01);
(Continued)

(58) Field of Classification Search
CPC . F21V 13/04; F21V 9/64; F21V 5/002; F21V 5/008; F21V 5/046; F21V 7/008;
(Continued)

(56) References Cited

U.S. PATENT DOCUMENTS 6,758,582 B1 * 7/2004 Hsiao .................... F21V 7/0025
362/302
7,414,270 B2 * 8/2008 Kim ........................ H01L 33/54
257/79

(Continued)

FOREIGN PATENT DOCUMENTS

CN          1841798        10/2006
CN          101900286 A    12/2010
(Continued)

OTHER PUBLICATIONS

Taiwanese Office Action dated May 4, 2017 issued in Application No. 101149271 (with English translation).

(Continued)

*Primary Examiner* — Bryon T Gyllstrom
(74) *Attorney, Agent, or Firm* — Ked & Associates, LLP

(57) ABSTRACT

A member for controlling luminous flux according to an exemplary embodiment of the present invention includes an optical path changing unit embedded in a matrix and including scattering particles scattering incident light, and an optical direction adjustment unit including a coupling surface attached to the optical path changing unit to receive the light scattered from the optical path changing unit, and a refractive surface refracting the received light and emitting (Continued)

the refracted light, whereby an optical diffusion performance of the member for controlling luminous flux according to an exemplary embodiment of the present invention can enhance an optical diffusion performance.

15 Claims, 14 Drawing Sheets

(51) Int. Cl.
    *H01L 33/50* (2010.01)
    *H01L 33/60* (2010.01)
    *G02F 1/1335* (2006.01)
    *G02B 19/00* (2006.01)
    *H01L 33/54* (2010.01)
    *F21V 5/00* (2018.01)
    *F21V 5/04* (2006.01)
    *F21V 7/04* (2006.01)
    *F21V 7/09* (2006.01)
    *F21V 13/02* (2006.01)
    *F21V 23/00* (2015.01)
    *F21K 9/64* (2016.01)
    *F21Y 115/10* (2016.01)

(52) U.S. Cl.
    CPC ............ *F21V 5/046* (2013.01); *F21V 7/0008* (2013.01); *F21V 7/0066* (2013.01); *F21V 7/045* (2013.01); *F21V 7/09* (2013.01); *F21V 13/02* (2013.01); *F21V 23/005* (2013.01); *G02B 19/0014* (2013.01); *G02B 19/0061* (2013.01); *G02F 1/133603* (2013.01); *H01L 33/505* (2013.01); *H01L 33/54* (2013.01); *H01L 33/60* (2013.01); *F21Y 2115/10* (2016.08); *H01L 2933/005* (2013.01); *H01L 2933/0041* (2013.01); *H01L 2933/0091* (2013.01)

(58) Field of Classification Search
    CPC .......... F21V 7/0066; F21V 7/045; F21V 7/09; F21V 13/02; F21V 23/005; G02B 19/0017; G02B 19/0064; G02F 1/133603; H01L 33/505; H01L 33/54; H01L 33/60
    USPC ......................................................... 362/84
    See application file for complete search history.

(56) References Cited

U.S. PATENT DOCUMENTS

| | | | | |
|---|---|---|---|---|
| 8,591,072 B2* | 11/2013 | Shani | .................... | G02B 6/0021 362/296.01 |
| 8,814,391 B2* | 8/2014 | Koh | .................... | G02B 6/0021 313/512 |
| 9,075,172 B2* | 7/2015 | Koh | .................... | G02B 6/0021 |
| 2003/0189832 A1* | 10/2003 | Rizkin | .................... | F21V 5/046 362/302 |
| 2005/0139851 A1* | 6/2005 | Sato | .................... | H01L 33/507 257/99 |
| 2006/0262538 A1 | 11/2006 | Li et al. | | |
| 2008/0128725 A1* | 6/2008 | Hsing Chen | ............ | H01L 33/60 257/98 |
| 2009/0147513 A1 | 6/2009 | Kolodin et al. | ............... | 362/241 |
| 2010/0110661 A1* | 5/2010 | Park | ................... | G02F 1/133603 362/97.1 |
| 2010/0220484 A1* | 9/2010 | Shani | .................... | G02B 5/021 362/296.09 |
| 2010/0302766 A1* | 12/2010 | Lai | .......................... | F21S 8/086 362/183 |
| 2011/0069496 A1* | 3/2011 | Ing | .................... | B29D 11/00798 362/311.02 |

FOREIGN PATENT DOCUMENTS

| | | |
|---|---|---|
| CN | 102032528 | 4/2011 |
| CN | 102097423 | 6/2011 |
| CN | 103117348 | 5/2013 |
| DE | 10-2010-021011 A1 | 11/2011 |
| DE | 10-2010-038396 A1 | 1/2012 |
| EP | 2 323 183 A1 | 5/2011 |
| EP | 2 595 205 A2 | 5/2013 |
| JP | 2008-277248 A | 11/2008 |
| JP | 3151273 U | 5/2009 |
| KR | 10-2012-0015854 A | 2/2009 |
| KR | 10-2012-0049650 A | 5/2012 |
| TW | 200707005 A | 2/2006 |
| TW | 200826311 | 6/2008 |
| TW | 201203614 | 1/2012 |

OTHER PUBLICATIONS

European Search Report dated Mar. 9, 2016 issued in Application No. 12877860.2.
Taiwanese Office Action dated Dec. 22, 2015 issued in Application No. 104107534.
International Search Report dated Mar. 29, 2013 issued in Application No. PCT/KR2012/010937.
Korean Office Action dated May 29, 2013 issued in Application No. 10-2012-0058852.
Korean Office Action dated May 29, 2013 issued in Application No. 10-2012-0058857.
Chinese Office Action dated Jan. 19, 2018 issued in Application No. 201280075060.9 (with English Translation).

* cited by examiner

MEMBER FOR CONTROLLING LUMINOUS FLUX, METHOD FOR FABRICATING THE MEMBER, AND DISPLAY DEVICE HAVING THE MEMBER

CROSS-REFERENCE TO RELATED PATENT APPLICATIONS

This application is a U.S. National Stage Application under 35 U.S.C. § 371 of PCT Application No. PCT/KR2012/010937, filed Dec. 14, 2012, which claims priority to Korean Patent Application Nos. 10-2012-0058852 and 10-2012-0058857, both filed May 31, 2012, whose entire disclosures are hereby incorporated by reference.

TECHNICAL FIELD

The teachings in accordance with exemplary and non-limiting embodiments of this invention relate generally to a member for controlling luminous flux, method for fabricating the member, display device and light emitting device.

BACKGROUND ART

Generally, due to the characteristics of light weight, slim thickness, low electric power consumption, the liquid crystal display device (or, LCD) is being widely applied. The LCD displays a picture data (or an image) by using the physical property of crystal that changes array in response to voltage or temperature.

As LCD is not a self-luminescent element, the LCD requires a backlight unit for irradiating light to the liquid crystal display panel. There are two kinds of the backlight units for LCD, one is the direct type backlight unit and the other is the edge type backlight system. The most common LCD shows the picture data by modulating the luminescence of the light incident from the backlight unit by controlling the electric field applied to the liquid crystal layer.

For the edge type backlight unit, light source such as a fluorescent light source is equipped at the circumferences of the transparent light guide panel. The light radiated from the fluorescent light source to the side surface of the light guide panel is refracted and/or reflected to the front side on which an LCD panel is disposed. On the other hands, for the direct type backlight unit, a plurality of fluorescent light sources are disposed under the back side of the LCD panel so that the light is directly radiated from the light source to the overall surface of the LCD panel.

However, the abovementioned backlight units suffer from disadvantages of light being irregularly radiated to the LCD panel. As a result, the physical properties of LCD may be degraded. Thus there is required an effort to improve brightness uniformity of the LCD.

DISCLOSURE

Technical Problem

Accordingly, the present invention has been made keeping in mind the above disadvantages/problems occurring in the prior art, and an object of the present invention is to provide a member for controlling luminous flux, method for fabricating the member, display device and light emitting device, configured to improve brightness uniformity.

Technical Solution

In order to accomplish the above object, the present invention provides a member for controlling luminous flux (hereinafter referred to as "luminous flux control member"), the member comprising: an optical path changing unit embedded in a matrix and including scattering particles scattering incident light; and an optical direction adjustment unit including a coupling surface attached to the optical path changing unit to receive the light scattered from the optical path changing unit, and a refractive surface refracting the received light and emitting the refracted light.

Preferably, but not necessarily, the optical path changing unit may include an incident surface receiving light, a light emitting surface opposite to the incidence surface, and a connection surface connected to the incidence surface and the light emitting surface, and attached to the coupling surface.

Preferably, but not necessarily, the optical path changing unit may include an optical converting unit converting and scattering the light, and a path changing unit stacked on the optical converting unit to re-scatter the scattered light.

Preferably, but not necessarily, the connection surface may be divided by a first connection surface contacting the coupling surface at the optical converting unit, and a second connection surface contacting the coupling surface at the path changing unit, and the optical path changing unit may further include a mid-surface defining the optical converting unit and the path changing unit at a border between the optical converting unit and the path changing unit.

Preferably, but not necessarily, a refractive index of the optical converting unit may be less than a refractive index of the path changing unit.

Preferably, but not necessarily, an angle formed by the coupling surface and a normal axis of a center axis extended from a center of the incident surface to a center of the light emitting surface may exceed 30°, but may be less than 100°.

Preferably, but not necessarily, the light emitting surface may be concavely or convexly formed relative to the incident surface, or may be formed with at least one inflection point.

Preferably, but not necessarily, the optical direction adjustment unit may include a silicon resin.

Preferably, but not necessarily, a refractive index of the scattering particle may exceed a refractive index of the matrix.

Preferably, but not necessarily, the scattering particles may include titanium dioxide and phosphor.

In another general aspect of the present invention, there is provided a display device, the device comprising: a light source outputting light; a driving substrate mounted with the light source; a luminous flux control member mounted on the driving substrate for receiving the outputted light and emitting the received light, and a display panel receiving the emitted light, wherein the luminous flux control member includes an optical path changing unit embedded with scattering particles scattering the outputted light; and an optical direction adjustment unit including a coupling surface attached to the optical path changing unit to receive the light scattered from the optical path changing unit, and a refractive surface refracting the received light and emitting the refracted light.

Preferably, but not necessarily, the optical path changing unit may include an incident surface receiving the outputted light, a light emitting surface opposite to the incidence surface, and a connection surface connected to the incidence surface and the light emitting surface, and attached to the coupling surface.

Preferably, but not necessarily, the optical path changing unit may include an optical converting unit converting and scattering the outputted light, and a path changing unit stacked on the optical converting unit to re-scatter the scattered light.

In still another general aspect of the present invention, there is provided a light emitting device, the device comprising: a light source outputting light; a driving substrate mounted with the light source; and a luminous flux control member mounted on the driving substrate for receiving the outputted light and emitting the received light, wherein the luminous flux control member includes an optical path changing unit embedded with scattering particles scattering the outputted light; and an optical direction adjustment unit including a coupling surface attached to the optical path changing unit to receive the light scattered from the optical path changing unit, and a refractive surface refracting the received light and emitting the refracted light.

Preferably, but not necessarily, the optical path changing unit may include an optical converting unit converting and scattering the light, and a path changing unit stacked on the optical converting unit to re-scatter the scattered light.

In still further general aspect of the present invention, there is provided a member for controlling luminous flux, the member comprising: a refractive unit; and a reflective unit partially or totally inserted into the refractive unit, wherein the refractive unit includes an incident surface receiving light, a light emitting surface emitting the light from the incident surface, and wherein the reflective unit is arranged opposite to the incident surface.

Preferably, but not necessarily, the reflective unit may include a reflective surface reflecting the light from the incident surface.

Preferably, but not necessarily, the reflective surface may include a curved surface.

Preferably, but not necessarily, the reflective unit may include a spherical surface.

Preferably, but not necessarily, the reflective unit may take a shape of a horn or a frustum.

Preferably, but not necessarily, the reflective unit may face the incident surface.

Preferably, but not necessarily, the refractive unit may include a contact surface directly brought into contact with the reflective unit, and the refractive surface may be extended by being bent from the contact surface.

Preferably, but not necessarily, the reflective unit may take a shape of a sphere.

Preferably, but not necessarily, the refractive unit may cover $3/5$ to $99/100$ of an outside surface of the reflective unit.

In still further general aspect of the present invention, there is provided a display device, the device comprising: a light source; a luminous flux control member receiving light from the light source; and a display panel receiving light from the luminous flux control member, wherein the luminous flux control member includes a refractive unit receiving the light from the light source, and a reflective unit partially or totally inserted into the refractive unit to reflect the light from the light source, and wherein the reflective unit faces an incident surface of the refractive unit.

Preferably, but not necessarily, the reflective unit may be arranged on an optical axis of the light source.

Preferably, but not necessarily, the display device may further comprise a driving substrate electrically connected to the light source, and the luminous flux control member may be brought into close contact with the light source and the driving substrate.

Preferably, but not necessarily, the reflective unit may take a shape of a particle.

In still further general aspect of the present invention, there is provided a method for fabricating a luminous flux control member, the method comprising: arranging a reflective unit inside a mold; and arranging a transparent resin inside the mold to partially or totally cover the reflective unit.

Preferably, but not necessarily, the method may further comprise providing a driving substrate and a light source arranged on the driving substrate, wherein the transparent resin is brought into close contact with the driving substrate and the light source.

Advantageous Effects

Exemplary embodiments of the present invention can improve an optical diffusion performance, whereby a luminous flux control member of a light emitting device can radiate light more uniformly toward a display panel to improve performance of a display device and to thereby enhance a brightness uniformity of the display device.

A member for controlling luminous flux according to exemplary embodiments of the present invention inserts a reflective unit into a refractive unit, whereby the member for controlling luminous flux according to exemplary embodiments of the present invention can adjust a shape of the reflective unit as desired. Particularly, the member for controlling luminous flux according to exemplary embodiments of the present invention can be inserted into the refractive unit to form a reflective surface of the reflective unit as desired, regardless of a shape or design of the refractive unit.

Thus, the exemplary embodiments of the present invention can provide a member for controlling luminous flux capable of diffusing incident light as desired, a display device and a method for fabricating the member for controlling luminous flux. As a result, the member for controlling luminous flux, the display device and the method for fabricating the member for controlling luminous flux according to the exemplary embodiments of the present invention can effectively control the luminous flux to accomplish brightness uniformity.

DESCRIPTION OF DRAWINGS

The teachings of the present invention can be readily understood by considering the following Detailed Description in conjunction with the accompanying drawings, in which.

BEST MODE

Figure 1:
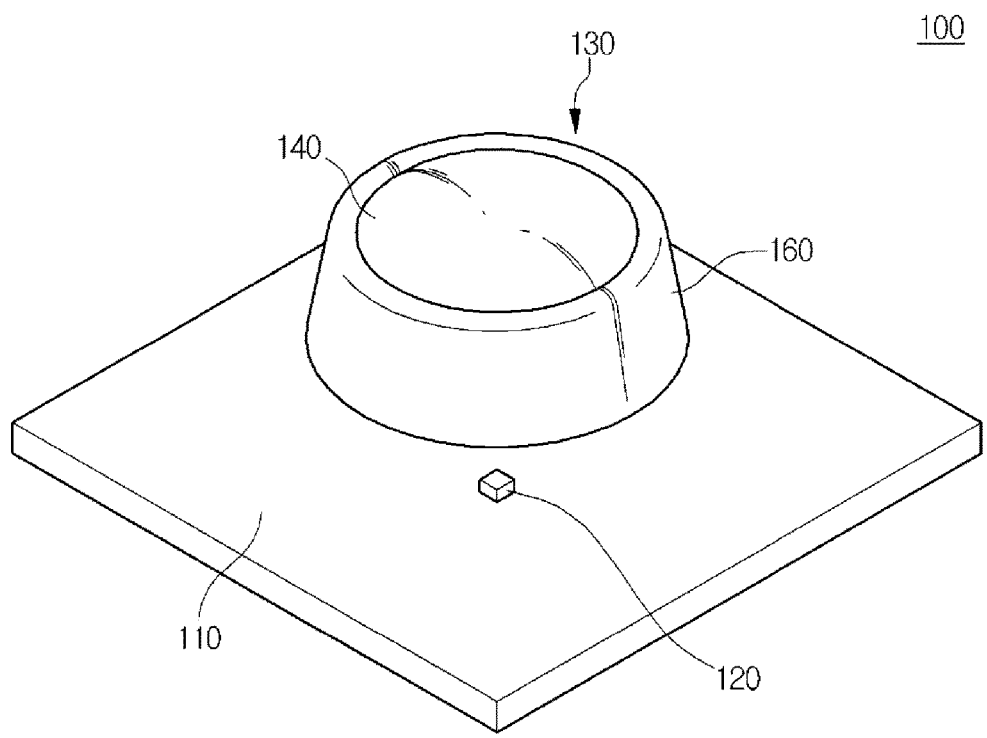
FIG. 1 is an exploded perspective view illustrating a light emitting device according to a first exemplary embodiment of the present invention.

Hereinafter, exemplary embodiments will be described in detail with reference to the accompanying drawings, wherein the same reference numerals are used to denote the same or substantially the same devices throughout the specification and the drawings. Accordingly, in some embodiments, well-known processes, well-known device structures and well-known techniques are not illustrated in detail to avoid unclear interpretation of the present invention.

In the drawings, it will be understood that when a panel (a sheet, a member, a guide or a unit) is referred to as being 'on' or 'under' another panel (another sheet, another member, another guide or another unit), it can be directly on or under the other panel (sheet, member, guide or unit), or intervening panels (sheets, members, guides or units) may also be present. In the drawings, the dimensions, such as sizes or thicknesses, of layers or films are exaggerated, omitted, or schematically shown for clarity of illustration. Accordingly, the sizes of the devices in the drawings do not thoroughly reflect real sizes of devices.

Furthermore, the term of 'surface' and 'plane' may be interchangeably used. FIG. 1 is an exploded perspective view illustrating a light emitting device according to a first exemplary embodiment of the present invention, and FIG. 2 is a cross-sectional view illustrating one cross-section of a light emitting device according to a first exemplary embodiment of the present invention.

Figure 2:
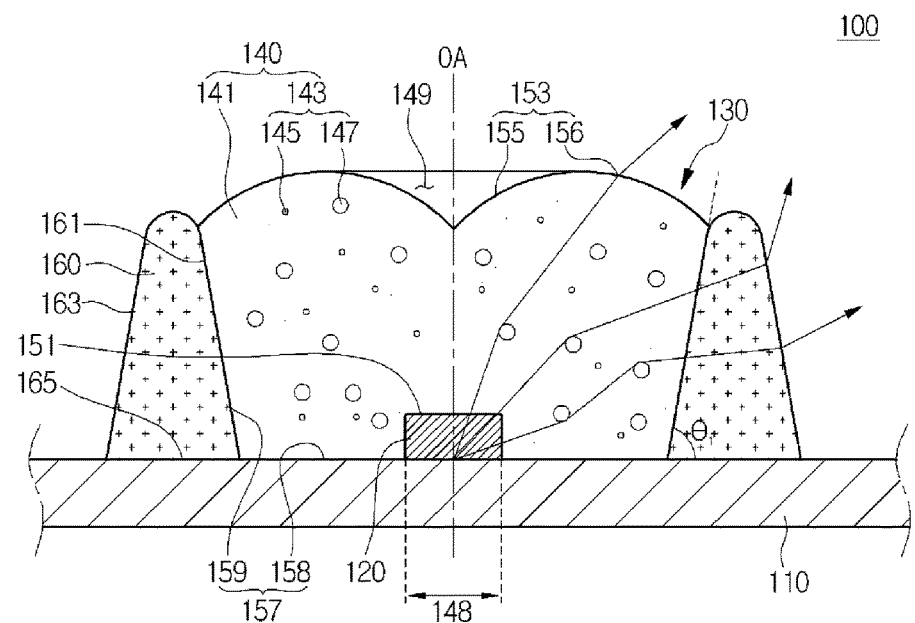
FIG. 2 is a cross-sectional view illustrating one cross-section of a light emitting device according to a first exemplary embodiment of the present invention.

Referring to FIGS. 1 and 2, a light emitting device (100) according to an exemplary embodiment of the present invention includes a driving substrate (110), a light source (120), and a member for controlling luminous flux (hereinafter referred to as a luminous flux control member, 130).

The driving substrate (110) is provided for support and driving control. The driving substrate (110) may be a PCB (Printed Circuit Board). That is, the driving substrate (110) may be realized by a flat plate. Furthermore, the driving substrate (110) is formed with a dielectric substance embedded with a plurality of a transmission lines (not shown). At this time, the driving substrate (110) may be realized by stacking a plurality of dielectric plates. At this time, each transmission line is exposed to an outside through both distal ends. At this time, a distal end of the transmission line is connected to a driving unit (not shown). Furthermore, the other distal end of the transmission line is exposed to an outside to form a connection terminal, through which the transmission line transmits a driving signal to the connection terminal of the other distal end, in a case the driving signal is received from the driving unit through the one distal end.

The light source (120) substantially generates light and outputs the light. The light source (120) is mounted on the driving substrate (110). At this time, the light source (120) may be contacted to a connection terminal of the driving substrate (110) via a paste to be electrically connected to the driving substrate (110). Furthermore, the light source (120) is operated to generate light, in a case a driving signal is received from the driving substrate (110). At this time, the light source (120) can adjust a light amount (luminous energy) in response to intensity of voltage applied from the driving substrate (110).

By way of non-limiting example, the light source (120) may be a point light source such as an LED (Light Emitting Diode), and may be a surface light source formed by arranging a plurality of LEDs. That is, the light source (120) may be realized by a structure in which a plurality of LEDs is dispersed and arranged on the driving substrate (110) each spaced apart at a predetermined distance. At this time, each of the LEDs is defined by a light emitting diode package including a light emitting diode chip. Furthermore, the LEDs may emit white light, and may emit a blue light, a green light and a red light respectively.

The luminous flux control member (130) scatters light incident from the light source (120). The luminous flux control member (130) is mounted on the driving substrate (110). Furthermore, the luminous flux control member (130) covers the light source (120) on the driving substrate (110). At this time, an OA (Optical Axis) of the light source (120) passes a center of the luminous flux control member (130). By way of non-limiting example, the luminous flux control member (130) may individually cover each of the LEDs. At this time, the luminous flux control member (130) may accommodate a part or a total of the light source (120). Furthermore, the luminous flux control member (130) includes an optical path changing unit (140) and an optical direction adjustment unit (150).

The optical path changing unit (140) changes a path of light incident from the light source (120). The optical path changing unit (140) includes a matrix (141) and a plurality of scattering particles (143). The matrix (141) is formed with a transparent material. The matrix (141) passes the light incident from the light source (120). At this time, a refractive index of the matrix (141) may be 1.4 to 1.5. The matrix (141) may include a silicon resin, an epoxy resin and an acrylic resin.

The scattering particles (143) are embedded inside the matrix (141). That is, the scattering particles (143) are distributed on the matrix (141) by being dispersed on the matrix (141). The scattering particles (143) scatter the light incident through the matrix (141). At this time, a refractive index of each scattering particle may exceed a refractive index of the matrix (141). At this time, the refractive index of the scattering particle (143) may be 2.2. That is, a difference value between the refractive index of the scattering particle and the refractive index of the matrix (141) may be 0.4 to 0.5. Furthermore, a diameter of each of the scattering particles (143) may have a size corresponding to 500 nm to 10 μm.

At this time, the scattering particle (143) includes an optical conversion particle (145) and a path changing particle (147). The optical conversion particle (145) converts wavelength of the light incident from the light source (120). By way of non-limiting example, the optical conversion particle (145) may convert a blue light to a red light, or to a green light. Furthermore, the optical conversion particle (145) scatters the light incident from the light source (120). At this time, the optical conversion particle (145) may include a phosphor and a quantum dot. The path changing particle (147) include a titanium dioxide ($TiO_2$).

Furthermore, the optical path changing unit (140) includes an incident surface (151), a light emitting surface (153) and a connection surface (157). The incident surface (151) faces the light source (120), and is a surface receiving light from the light source (120) to the optical path changing unit (140). At this time, a center of the incident surface (151) is arranged on an OA (Optical Axis) of the light source (120). Furthermore, the incident surface (151) is tightly attached to the light source (120) to be directly contact the light source (120).

By way of non-limiting example, the optical path changing unit (140) may be formed at a bottom surface with a concave groove unit (148). The concave groove unit (148) of the optical path changing unit (140) may be formed to partially or totally accommodate the light source (120). That is, in a case the light source (120) is inserted into the concave groove unit (148) of the optical path changing unit (140), the incident surface (151) inside the concave groove unit (148) may be brought into contact with the light source (120). In other words, the incident surface (1510 may be provided to an inside of the concave groove unit (148), whereby the light can be incident on the optical path changing unit (140) from the light source (120) without being lost between the light source (120) and the optical path changing unit (140).

Meanwhile, the optical path changing unit (140) may not be formed at a bottom surface with a concave groove unit (148). That is, the incident surface (151) may be brought into contact with the light source (120) at the bottom surface of the optical path changing unit (140).

The light emitting surface (153) is a surface from which light is emitted. At this time, the light emitting surface (153) refracts the light. Furthermore, a center of the light emitting surface (153) is arranged on an OA of the light source (120). That is, the light emitting surface (153) may be so formed as to have an axially symmetrical structure about a center of the OA of the light source (120).

Furthermore, the light emitting surface (153) may be concavely or convexly formed relative to the incident surface (151). Alternatively, the light emitting surface (153) may be formed with at least one inflection point, where the inflection point means a point on a curve at which a curvature or concavity changes sign from plus to minus or from minus to plus. That is, the curve changes from being concave upwards (positive curvature) to being concave downwards (negative curvature), or vice versa.

By way of non-limiting example, a concave unit (149) may be formed at an upper surface of the optical path changing unit (140). The concave unit (149) may be concavely formed at a center of the optical path changing unit (140) relative to the light source (120). At this time, a center of the concave unit (149) is arranged on the OA of the light source (120), where the concave unit (149) may be formed to have an axially symmetrical structure about a center of an OA of the concave unit (149), whereby the light emitting surface (153) may be divided by a first light emitting surface (155) and a second light emitting surface (156).

The first light emitting surface (155) is provided inside the concave unit (149). The first light emitting surface (155) is extended from the OA of the light source (120). That is, the first light emitting surface (155) is perpendicular to the OA along an inner shape of the concave unit (149), or extended to an inclining outside. Furthermore, the first light emitting surface (155) reflects light from the optical path changing unit (140). At this time, the first light emitting surface (155) may totally reflect the light. As a result, the first light emitting surface (155) can prevent a hot spot from being generated by an excessive concentration of light to a center portion of the luminous flux control member (130).

The second light emitting surface (156) is provided to an outside of the concave unit (149). The second light emitting surface (156) is curved from the first light emitting surface (155) and extended to an outside of the first light emitting surface (155), where the curve means a slowly or gradually curving shape. That is, the second light emitting surface (156) is perpendicular to the OA, or extended to an inclining outside. In other words, the second light emitting surface (156) is arranged at a periphery of the light emitting surface (153), i.e., at a periphery of the concave unit (149) and the first light emitting surface (155). At this time, the second light emitting surface (156) may be spherical or aspheric. Furthermore, the second light emitting surface (156) emits light from the optical path changing unit (140), where the light may be reflected from the first light emitting surface (155) and emitted from the second light emitting surface (156).

The connection surface (157) connects the incident surface (151) to the light emitting surface (153), The connection surface (157) is divided into a first connection surface (158) and a second connection surface (159).

The first connection surface (158) faces the driving substrate (110), and is extended from the incident surface (151). Furthermore, the first connection surface (158) is extended to an outside direction perpendicular to the OA. The first connection surface (158) is closely attached to the driving substrate (110) at the periphery of the light source (120). The second connection surface (159) is extended from the first connection surface (158) to be connected to the first connection surface (158). At this time, the second connection surface (159) is a surface where light is emitted from the optical path changing unit (140), where the light may be reflected from the first light emitting surface (155) and emitted from the second connection surface (159). The second connection surface (159) wraps a surrounding of the OA.

The optical direction adjustment unit (160) serves to adjust a direction of light incident from the optical path changing unit (140). At this time, a refractive index of the optical direction adjustment unit (160) is less than a refractive index of the optical path changing unit (140). The optical direction adjustment unit (160) wraps the optical path changing unit (140) about the OA of the light source (120). By way of non-limiting example, the optical direction adjustment unit (160) may be formed in a shape of a ring. Furthermore, the optical direction adjustment unit (160) may be formed with a transparent material. The optical direction adjustment unit (160) may include a silicon resin, an epoxy resin and an acrylic resin. The optical direction adjustment unit (160) includes a coupling surface (161), a refractive surface (163) and a rear surface (165).

The coupling surface (161) is a surface where light is incident from the optical path changing unit (140) to the optical direction adjustment unit (160). At this time, the coupling surface (161) may be tightly attached to the connection surface (157) of the optical path changing unit (140), i.e., to the second connection surface (159) to be directly brought into contact with optical path changing unit (140). Then, the coupling surface (161) wraps the OA, where the coupling surface (161) may be realized in the same shape as that of the second connection surface (159). Furthermore, an angle ($\theta_1$) formed by the coupling surface (161) and a normal axis of the OA may exceed 30°, but may be less than 100°.

The refractive surface (163) is a surface (or plane) where light is emitted from the optical direction adjustment unit (160). At this time, the refractive surface (163) serves to refract the light. The refractive surface (163) is extended from the coupling surface (161). The refractive surface (163) encompasses the OA and encompasses a surrounding of the coupling surface (161).

The rear surface (165) functions to connect the coupling surface (161) to the refractive surface (163). At this time, the rear surface (165) faces the driving substrate (110). That is, the rear surface (165) is extended to an outside direction perpendicular to the OA. Furthermore, the rear surface (165) is tightly attached to the connection surface (157), i.e., to the driving substrate (110) at a periphery of the first connection surface (158).

That is, in the luminous flux control member (130) according to the exemplary embodiment of the present invention, the light is incident on the incident surface (151) and scattered on or from the scattering particles (143). Furthermore, the light on the luminous flux control member (130) is emitted to the light emitting surface (153) of the optical path changing unit (140) or to the refractive surface (163) of the optical direction adjustment unit (160).

That is, the light on the light path changing unit (140) is emitted to the light emitting surface (153) or to the connection surface (157), where the light may be reflected from the first light emitting surface (155), and emitted to the second light emitting surface (156) or the connection surface (157). Furthermore, the light on the optical direction adjustment unit (160) is incident on the coupling surface (161) and emitted to the refractive surface (163).

Figure 3:
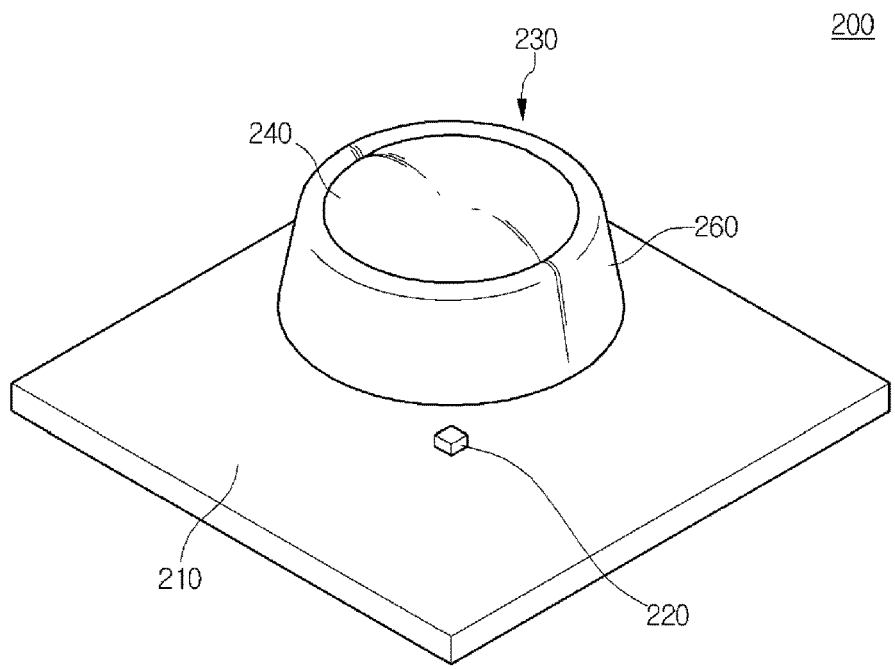
FIG. 3 is an exploded perspective view illustrating a light emitting device according to a second exemplary embodiment of the present invention.
Figure 4:
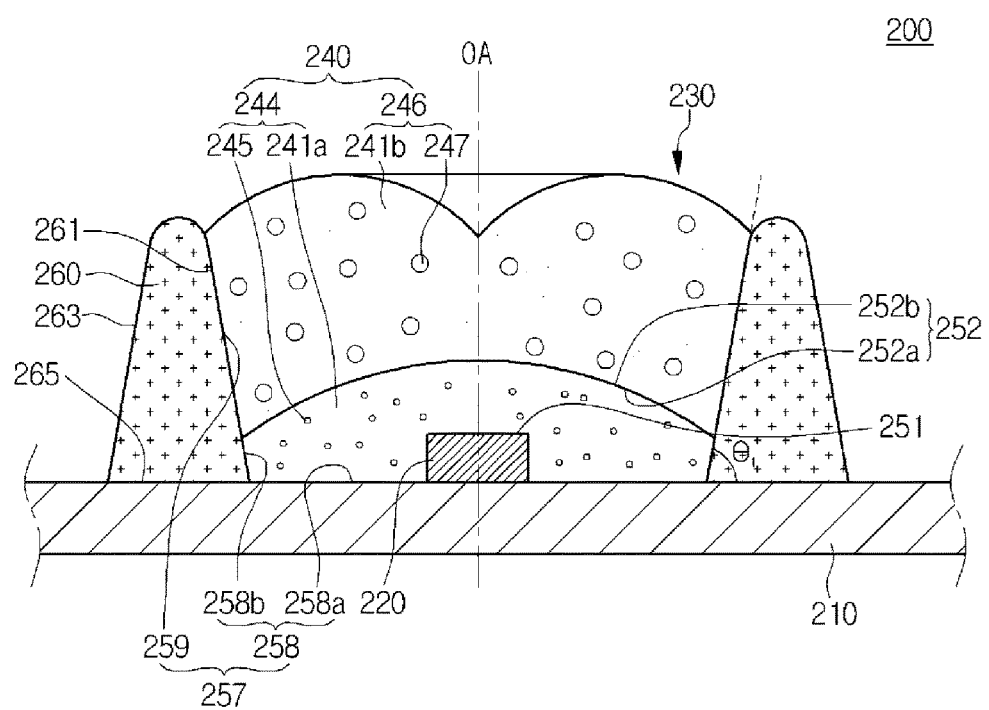
FIG. 4 is a cross-sectional view illustrating one cross-section of a light emitting device according to a second exemplary embodiment of the present invention.

FIG. 3 is an exploded perspective view illustrating a light emitting device according to a second exemplary embodiment of the present invention, and FIG. 4 is a cross-sectional view illustrating one cross-section of a light emitting device according to a second exemplary embodiment of the present invention.

Referring to FIGS. 3 and 4, the light emitting device according to the second exemplary embodiment of the present invention includes a driving substrate (210), a light source (120) and a luminous flux control member (230). At this time, the basic structures of the driving substrate (210), the light source (120) and the luminous flux control member (230) in the light emitting device (200) of the present exemplary embodiment of the present invention are substantially same as those of the previous one, such that no more detailed explanation and illustration will be omitted. However, there is a difference in terms of structure corresponding to that of the previous exemplary embodiment of the luminous flux control member (230) from that of the light emitting device (200) in the present exemplary embodiment, such that explanation and illustration of the present exemplary embodiment will be focused thereon.

In the light emitting device (200) according to the present exemplary embodiment, an optical path changing unit (240) of the luminous flux control member (230) includes an optical conversion unit (244) and a path changing unit (246). At this time, the optical path changing unit (240) is structurally realized by stacking the path changing unit (246) on the optical conversion unit (244).

Furthermore, the optical path changing unit (240) includes an incident surface (251), a mid-surface (252), a light emitting surface (253) and a connection surface (257). The mid-surface (252) is a plane formed between the optical conversion unit (244) and the path changing unit (246), as the path changing unit (246) and the optical conversion unit (244) are stacked. The mid-surface (252) is formed by a mid-light emitting surface (252a) and a mid-incident surface (252b), where the mid-light emitting surface (252a) and the mid-incident surface (252b) face each other. Furthermore, the connection surface (257) is divided into a first connection surface (258) and a second connection surface (259).

The optical conversion unit (244) converts wavelength of light incident from the light source (220). Furthermore, the optical conversion unit (244) changes a path of light incident from the light source (220). The optical conversion unit (244) includes a first matrix (241a) and a plurality of optical conversion particles (245).

The first matrix (241a) is formed with a transparent material. The first matrix (241a) passes the light incident from the light source (120). At this time, a refractive index of the first matrix (241a) may be 1.4 to 1.5. At this time, the first matrix (241a) may include a silicon resin, an epoxy resin and an acrylic resin. The plurality of optical conversion particles (245) is included in the first matrix (241a). That is, the optical conversion particles (245) are distributed on the first matrix (241a) by being dispersed thereon.

The optical conversion particle (245) converts wavelength of the light incident from the light source (120). By way of non-limiting example, the optical conversion particle (245) may convert a blue light to a red light, or to a green light. Furthermore, the optical conversion particle (245) scatters the light incident from the light source (220). At this time, each refractive index of the optical conversion particles (245) may exceed that of the first matrix (241a). The optical conversion particles (245) may include a phosphor and a quantum dot.

The optical conversion unit (244) includes an incident surface (251), a mid-light emitting surface (252a) and a first connection surface (258).

The incident surface (251) faces the light source (220), and is a surface receiving light from the light source (220) to the optical conversion unit (244). At this time, a center of the incident surface (251) is arranged on an OA (Optical Axis) of the light source (220). Furthermore, the incident surface (251) is tightly attached to the light source (220) to be directly contact the light source (220).

The mid-light emitting surface (252a) is a plane where light is emitted from the optical conversion unit (244). Furthermore, a center of the mid-light emitting surface (252a) is arranged on an OA of the light source (220). That is, the mid-light emitting surface (252a) may be so formed as to have an axially symmetrical structure about a center of the OA of the light source (220). The mid-light emitting surface (252a) may be totally formed with a curved surface. That is, the mid-light emitting surface (252a) may be convexly formed relative to the incident surface (251).

The first connection surface (258) is extended from the incident surface (251). At this time, the first connection surface (258) is extended to an outside direction perpendicular to the OA, and tightly brought into contact with the driving substrate (210) at the periphery of the light source (220). At this time, the first connection surface (258) may be extended to the outside direction perpendicular to the OA by changing a direction and being bent, whereby the first connection surface (258) may be divided into a substrate contact surface (258a) and a mid-connection surface (258b).

The substrate contact surface (258a) is extended to the outside direction perpendicular to the OA and tightly brought into contact with the driving substrate (210) at the periphery of the light source (220). The mid-connection surface (258b) is extended from the substrate contact surface (258a). At this time, the mid-connection surface (258b) is a plane where light is emitted from the optical conversion unit (244), and encompasses a periphery of the OA.

The path changing unit (246) serves to change a path of light incident from the optical conversion unit (244). At this time, a refractive index of the path changing unit (246) is less than a refractive index of the optical conversion unit (244). The path changing unit (246) includes a second matrix (241b) and a path changing particles (247). The second matrix (241b) may be formed with a transparent material. The second matrix (241b) passes light incident from the optical conversion unit (244). At this time, a refractive index of the second matrix (241b) may be less than that of the first matrix (241a). At this time, the refractive index of the second matrix (241b) may be 1.4 to 1.5. The second matrix (241b) may include a silicon resin, an epoxy resin and an acrylic resin.

The path changing particles (247) are embedded inside the second matrix (241b). That is, the path changing particles (247) re-scatters the light incident from the optical conversion unit (244). At this time, a refractive index of the path changing particles (247) may exceed that of the second matrix (241b). The path changing particle (247) include a titanium dioxide ($TiO_2$). Furthermore, the path changing unit (246) includes a mid-incident surface (252b), a light emitting surface (252b) and a second connection surface (259).

The mid-incident surface (252b) faces the mid-light emitting unit (252a), and is a surface receiving light from the optical conversion unit (244) to the path changing unit (246). At this time, a center of the mid-incident surface (252b) is arranged on an OA (Optical Axis) of the light source (220). Furthermore, the mid-incident surface (252b) may be tightly attached to the mid-light emitting surface (252a) to be directly contact the optical conversion unit (244). At this time, the mid-incident surface (252b) may take a shape same as that of a mid-light emitting surface (251a).

The mid-incident surface (252b) faces the mid-light emitting surface (252b), and is a plane where light is emitted from the optical conversion unit (244) to the path changing unit (246). Furthermore, a center of the mid-incident surface (252b) is arranged on an OA of the light source (220). Furthermore, the mid-incident surface (252b) may be tightly attached to the mid-light emitting surface (252a) to be directly contact the optical conversion unit (244). At this time, the mid-incident surface (252b) may take a shape same as that of the mid-light emitting surface (251a).

The light emitting surface (253) is a plane where light is emitted from the path changing unit (246). Furthermore, a center of the light emitting surface (253) is arranged on an OA of the light source (220). That is, the light emitting surface (253) may be so formed as to have an axially symmetrical structure about a center of the OA of the light source (220). The light emitting surface (253) may be totally formed with a curved surface. That is, the light emitting surface (253) may be convexly or concavely formed relative to the incident surface (251). Furthermore, the light emitting surface (253) may be so formed as to have at least one inflection point.

The second connection surface (259) is extended from the light emitting surface (253) to be connected to the first connection surface (258). At this time, the second connection surface (259) may be connected to the mid-connection surface (258b) of the first connection surface (258). At this time, the second connection surface (259) is a plane where light is emitted from the path changing unit (246). The second connection surface (259) encompasses a surrounding of the OA.

In the light emitting device (200) according to the present exemplary embodiment, the optical direction adjustment unit (260) includes a coupling surface (261), a refractive surface (263) and a rear surface (265).

The coupling surface (261) is a surface where light is incident from the optical path changing unit (240) to the optical direction adjustment unit (260). At this time, the coupling surface (261) may be tightly attached to the connection surface (257) of the optical path changing unit (240), i.e., to the second connection surface (259) to be directly brought into contact with optical path changing unit (240). At this time, the coupling surface (261) may be additionally and tightly attached to the mid-connection surface (258b) of the first connection surface (258) to individually contact the path changing unit (246) of the optical conversion unit (244). Furthermore, an angle ($\theta_1$) formed by the coupling surface (261) and the OA of the light source (220) may exceed 30°, but may be less than 100°.

The refractive surface (263) is a surface (or plane) where light is emitted. At this time, the refractive surface (263) serves to refract the light. The refractive surface (263) is extended from the coupling surface (261). The refractive surface (263) encompasses a surrounding of the coupling surface (261).

The rear surface (265) functions to connect the coupling surface (261) to the refractive surface (263). At this time, the rear surface (265) faces the driving substrate (210). That is, the rear surface (265) is extended to an outside direction perpendicular to the OA. Furthermore, the rear surface (265) is tightly attached to the connection surface (257), i.e., to the driving substrate (210) at a periphery of the first connection surface (258).

Figure 5:
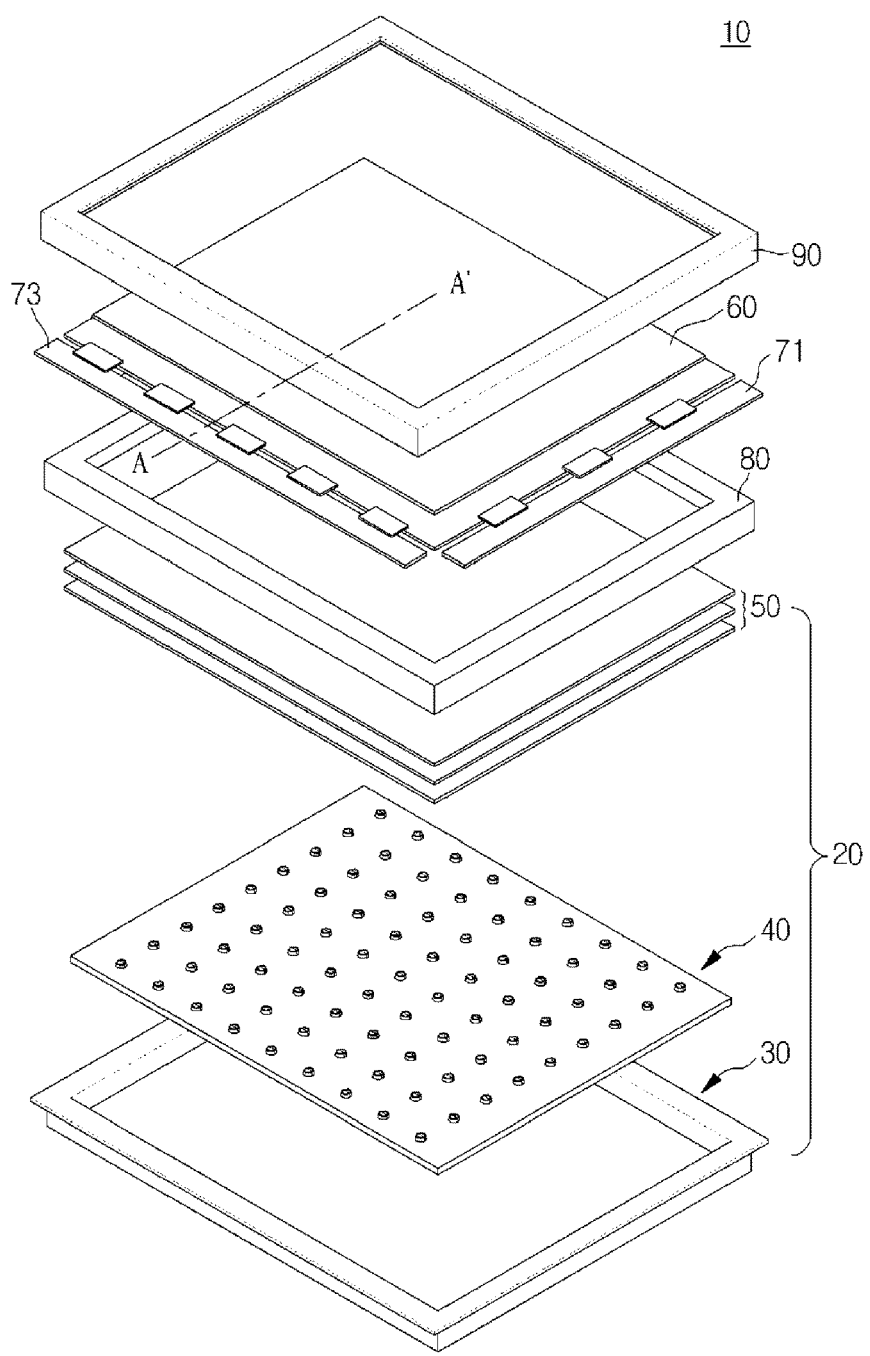
FIG. 5 is an exploded perspective view illustrating a liquid crystal display device according to an exemplary embodiment of the present invention.
Figure 6:
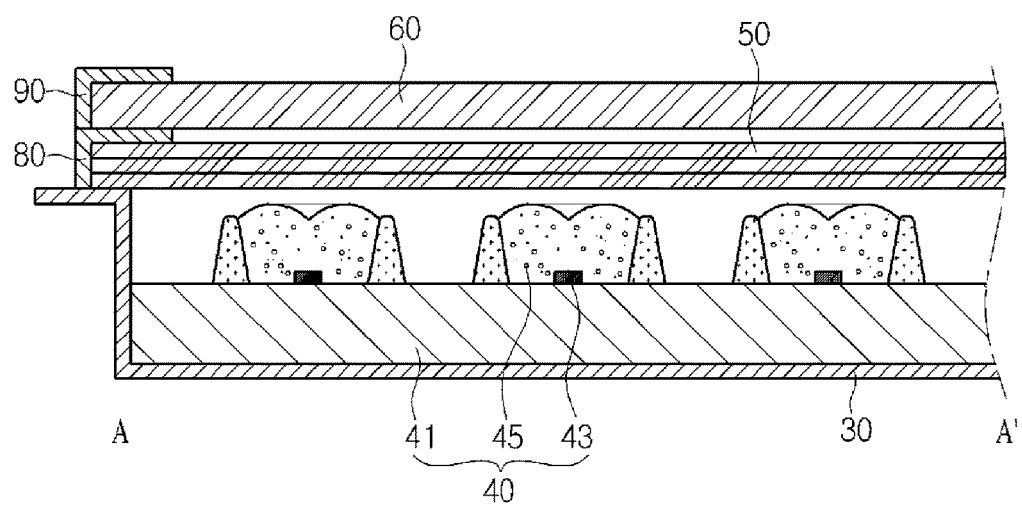
FIG. 6 is a cross-sectional view illustrating a cross-section taken along line A-A' of FIG. 5.

FIG. 5 is an exploded perspective view illustrating a liquid crystal display device according to an exemplary embodiment of the present invention, and FIG. 6 is a cross-sectional view illustrating a cross-section taken along line A-A' of FIG. 5.

Referring to FIGS. 5 and 6, a liquid crystal display device (10) according to the present exemplary embodiment of the present invention includes a backlight unit (20), a liquid crystal display panel (60), a panel control substrate (70), a panel guide (80) and an upper case (90).

The backlight unit (20) functions to output light by generating the light. At this time, the backlight unit (20) is realized by the direct type method according to an exemplary embodiment of the present invention. The backlight unit (20) includes a bottom cover (30), a light emitting device (40) and at least one optical sheet (50).

The bottom cover (30) takes a shape of an upper-opened box. The bottom cover (30) accommodates the light emitting device (40) through an upper surface to support and protect the light emitting device (40). Furthermore, the bottom cover (30) serves to support the optical sheet (50) and the liquid crystal display panel (60). At this time, the bottom cover (30) may be formed with a metal. By way of non-limiting example, the bottom cover (30) may be formed by bending or curving a metal plate. At this time, the metal plate being bent or curved, an insertion space of the light emitting device (40) may be formed at the bottom cover (30).

The light emitting device (40) includes a driving substrate (41), a plurality of light sources (43) and a plurality of luminous flux control members (45). The light sources (43) are mounted on the large-sized driving substrate (41), where the light sources (43) on the driving substrate (41) may be arranged by being dispersed each at a predetermined distance. By way of non-limiting example, the light sources (43) may be arranged in a grid structure. Furthermore, the light sources (43) are electrically connected to the driving substrate (41).

The luminous flux control members (45) individually cover the light sources (43). At this time, the luminous flux control members (45) may be formed as mentioned above. The luminous flux control members (45) emit light by scattering the light incident from the light sources (43). The optical sheet (50) passes the light by improving the performance of light incident from the light emitting device (40). At this time, the optical sheet (50) may be a polarizing sheet, a prism sheet or a diffusion sheet.

The liquid crystal display panel (60) functions to display a pictorial image by using light incident from the backlight unit (20). The liquid crystal display panel (60) is mounted on the backlight unit (20) through a rear surface.

Although not illustrated, the liquid crystal display panel (60) includes, for coherence to maintain a uniform gap by facing each other, a TFT (Thin Film Transistor) substrate, a C/F (Color Filter) substrate and a liquid crystal layer interposed between the TFT substrate and the C/F substrate. The TFT substrate changes alignment of liquid in the liquid crystal layer, whereby the TFT substrate changes an optical transmittance of light having passed the optical sheet. The TFT substrate is structurally configured such that a plurality of gate lines is formed, a plurality of data lines crossing the plurality of data lines is formed and TFTs are formed at a crossing area between the gate lines and the data lines. Furthermore, the C/F substrate expresses the light having passed the liquid crystal layer in a predetermined color.

Panel control substrates (71, 73) are provided to control the liquid crystal display panel (60). The panel control substrates (71, 73) include a gate driving substrate (71) and a data driving substrate (73). At this time, the panel control substrates (71, 73) are electrically connected to the liquid crystal display panel (60) by a COF (Chip On Film), where the COF may be changed to a TCP (Tape Carrier Package). The panel guide (80) supports the liquid crystal display panel (60). The panel guide (80) is arranged between the backlight unit (20) and the liquid crystal display panel (60). The upper case (90) is constructed to encompass an edge of the liquid crystal display panel (60), and may be coupled to the panel guide (80).

The present invention can prevent an excessive concentration of light at a center portion of the luminous flux control member, because a light emitting surface of the luminous flux control member is concavely or convexly formed, and is so formed as to have at least one inflection point. Furthermore, light scattered by the optical path changing unit is refracted again by the optical direction adjustment unit to enhance an optical diffusion performance, whereby light can be more uniformly radiated toward the liquid crystal display panel to enhance the performance of the display device, and to enhance the brightness uniformity of the display device.

Figure 7:
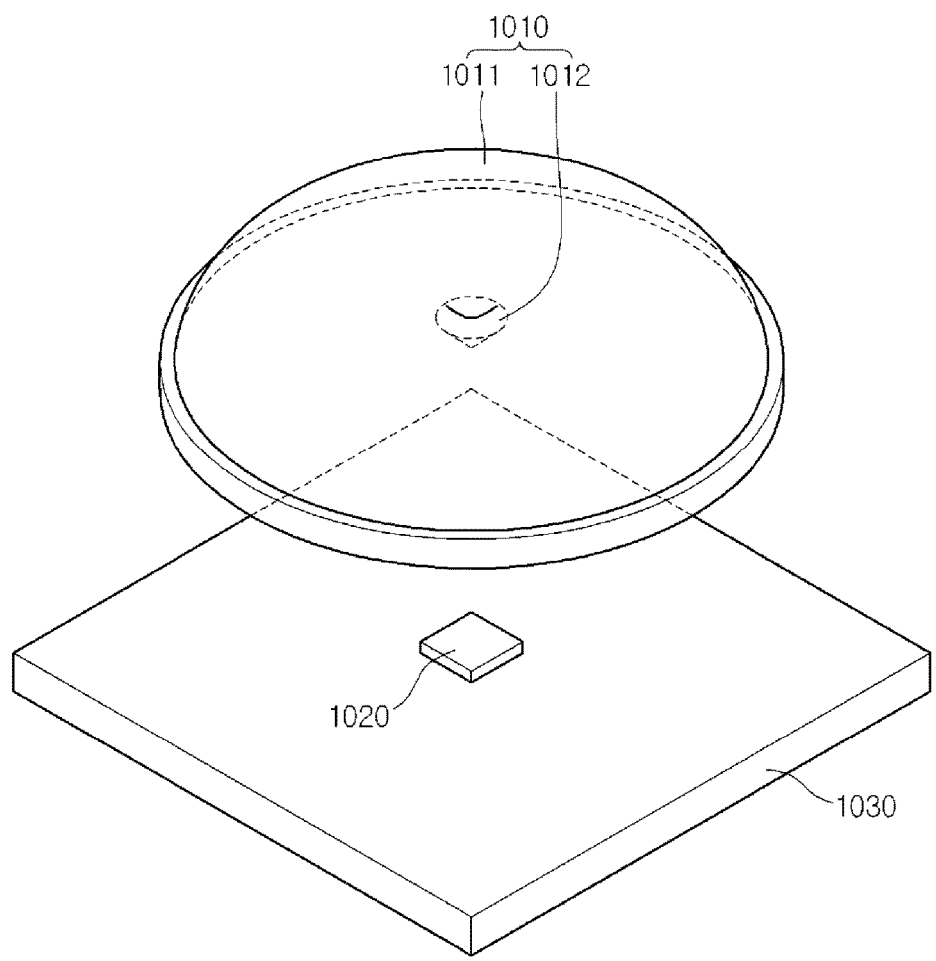
FIG. 7 is an exploded perspective view illustrating a light emitting device according to an exemplary embodiment of the present invention.
Figure 8:
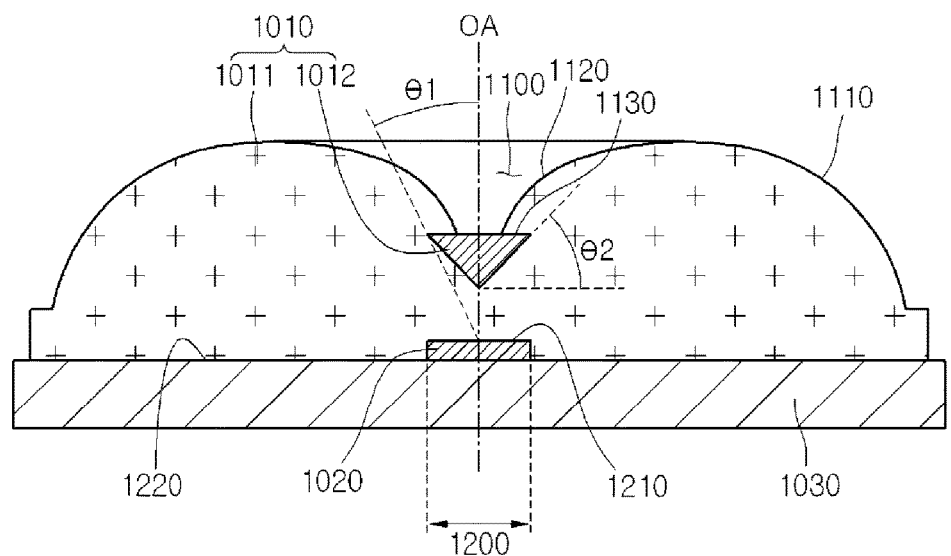
FIG. 8 is a cross-sectional view illustrating a cross-section of a light emitting device according to an exemplary embodiment of the present invention.
Figure 9:
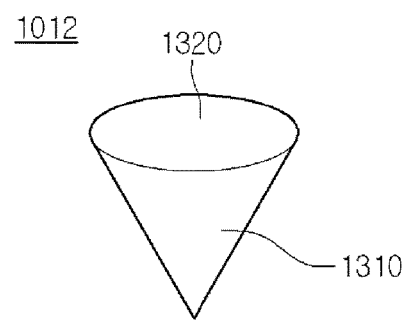
FIGS. 9 and 10 are perspective views illustrating one shape of a reflective unit.
Figure 10:
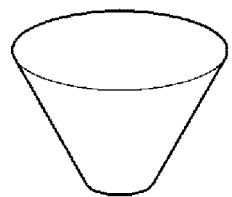
Figure 11:
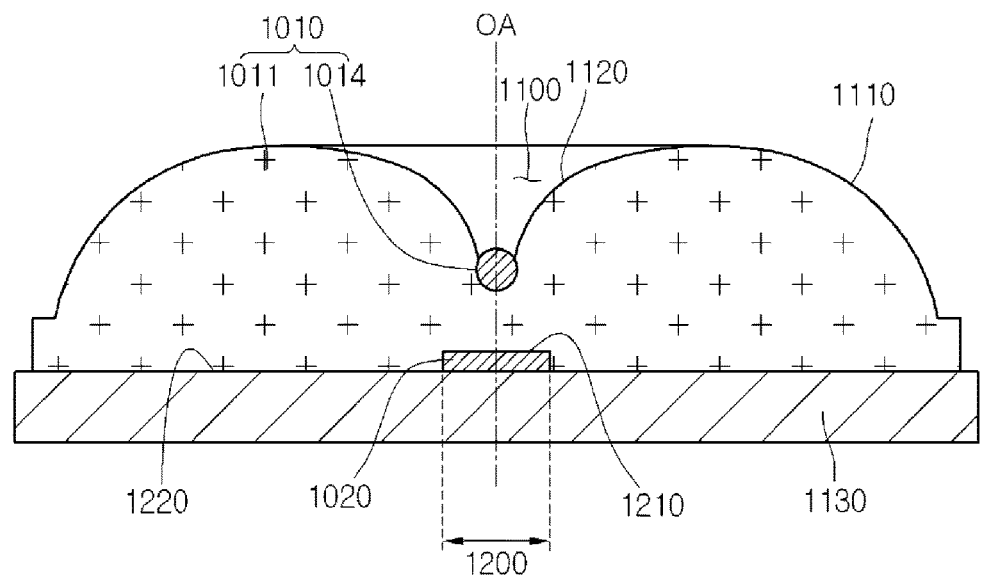
FIG. 11 is a cross-sectional view illustrating one cross-section of a light emitting device according to another exemplary embodiment of the present invention.
Figure 12:
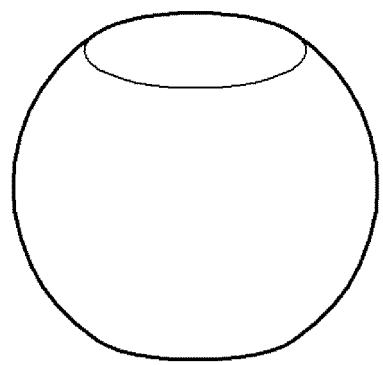
FIG. 12 is a perspective view illustrating one shape of a reflective unit according to another exemplary embodiment of the present invention.
Figure 13:
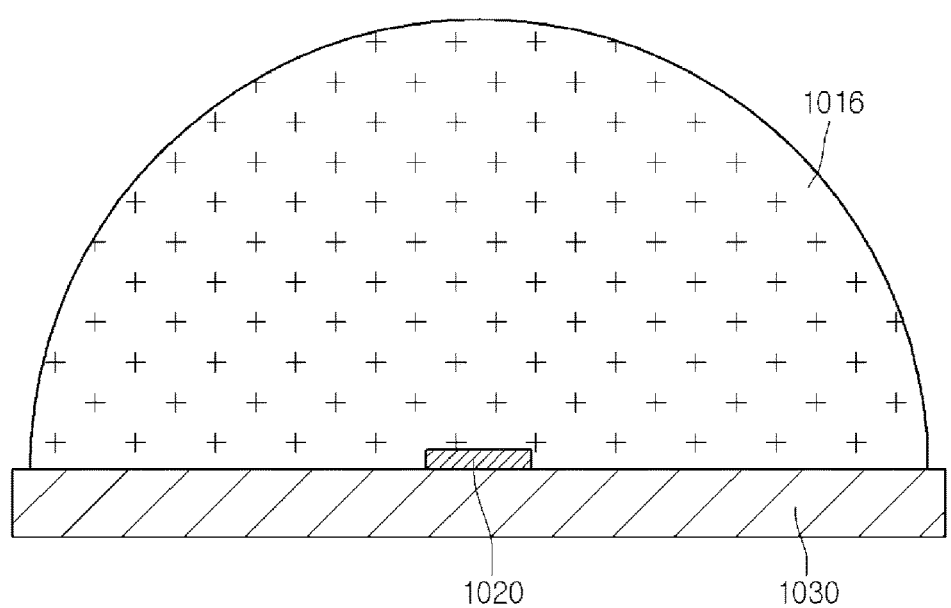
FIGS. 13, 14 and 15 are schematic views illustrating processes of forming a luminous flux control member.
Figure 14:
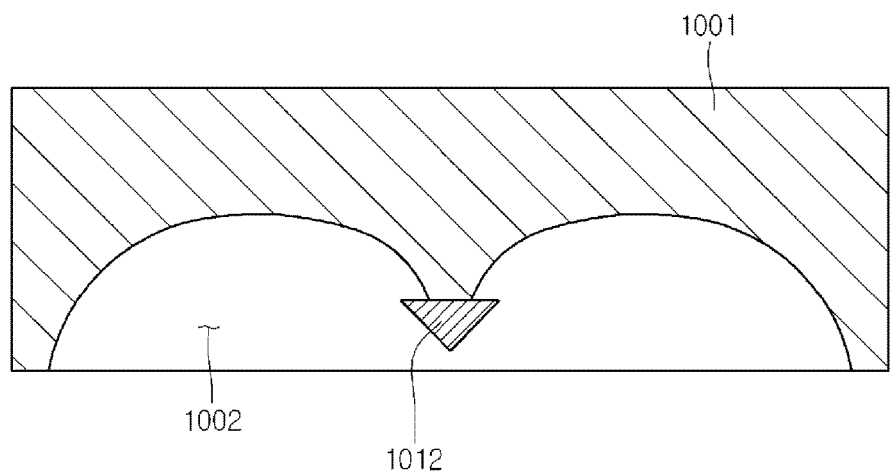
Figure 15:
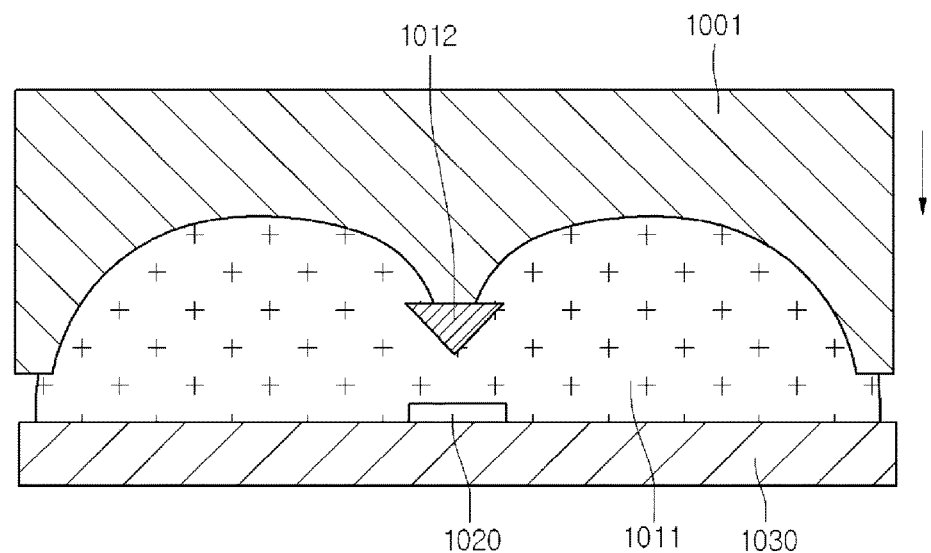

FIG. 7 is an exploded perspective view illustrating a light emitting device according to an exemplary embodiment of the present invention, FIG. 8 is a cross-sectional view illustrating a cross-section of a light emitting device according to an exemplary embodiment of the present invention, FIGS. 9 and 10 are perspective views illustrating one shape of a reflective unit, FIG. 11 is a cross-sectional view illustrating one cross-section of a light emitting device according to another exemplary embodiment of the present invention, FIG. 12 is a perspective view illustrating one shape of a reflective unit according to another exemplary embodiment of the present invention, and FIGS. 13, 14 and 15 are schematic views illustrating processes of forming a luminous flux control member.

Referring to FIGS. 7 to 15, the light emitting device according to exemplary embodiments of the present invention include a luminous flux control member (1010), a light source, e.g., a light emitting diode (1020) and a driving substrate (1030).

The luminous flux control member (1010) is arranged on the driving substrate (1030). The luminous flux control member (1010) covers the light emitting diode (1020). The luminous flux control member (1010) may partially or totally accommodate the light emitting diode (1020). The luminous flux control member (1010) is incident with light emitted from the light emitting diode (1020). The luminous flux control member (1010) includes a refractive unit (1011) and a reflective unit (1012).

The refractive unit (1012) receives the light from the light emitting diode (1020), refracts the light and emits the refracted light. The refractive unit (1012) is transparent. The refractive unit (1012) includes an incident surface (1210) and a refractive surface (1110) and a rear surface (1220).

The incident surface (1210) is a plane where light is incident from the light emitting diode (1020). The incident surface (1210) is a plane facing the light source. The incident surface (1210) may directly be brought into contact with the light emitting diode (1020). To be more specific, the incident surface (1210) may be a plane directly and tightly contacting the light emitting diode (1020). Particularly, the refractive unit (1011) may be formed with a concave unit (1200).

The concave unit (1200) corresponds to the light emitting diode (1020). Furthermore, the concave unit (1200) faces a depressed unit (1100). The concave unit (1200) is formed underneath the refractive unit (1011). That is, the concave unit (1200) is formed at a bottom surface of the refractive unit (1011).

The concave unit (1200) is arranged with the light emitting diode (20). To be more specific, a part or a total of the light emitting diode (1020) is arranged inside the concave unit (1200). That is, the part or the total of the light emitting diode (1020) is arranged inside the refractive unit (1011).

At this time, the light emitted from the light emitting diode (1020) may be incident through an inner surface of the concave unit (1200). As a result, the inner surface of the concave unit (1200) may be an incident surface (1210) to which the light is received. That is, the refractive unit (1011) may receive most of the light through the inner surface of the concave unit (1200). Alternatively, the refractive unit (1011) may not be formed with the concave unit (1200). At this time, the light emitting diode (1020) may be arranged at the flat rear surface (1220) of the refractive unit (1011). At this time, a part of the rear surface (1220) may be the incident surface (1210).

Furthermore, the refractive unit (1011) is formed with the depressed unit (1100). The depressed unit (1100) is formed at an upper surface of the refractive unit (1011). The depressed unit (1100) corresponds to the light emitting diode (1020). Furthermore, the depressed unit (1100) is depressed toward the light emitting diode (1020). Still furthermore, the depressed unit (1100) is caved in toward the light emitting diode (1020). The depressed unit (1100) is formed at a center of the refractive unit (1011).

A center of an inner surface of the depressed unit (1100) is arranged with an OA (Optical Axis) of the light emitting diode (1020). That is, the OA of the light emitting diode (1020) passes the center of the inner surface of the depressed unit (1100). Furthermore, the depressed unit (1100) may have an axially symmetrical structure about a center of the OA of the light emitting diode (1020).

Furthermore, a center of an inner surface of the concave unit (1200) may be arranged on the OA of the light emitting diode (1020). The OA of the light emitting diode (1020) may pass the center of inner surface of the depressed unit (1100) and a center of the inner surface of the concave unit (1200).

The refractive surfaces (1110, 1120) emit light from the incident surface (1210). Furthermore, the refractive surfaces (1110, 1120) refract the light incident to the luminous flux control member (1010). Each of the refractive surfaces (1110, 1120) may be formed with a curved surface on the whole. The refractive surfaces (1110, 1120) include a first refractive surface (1110) and a recess surface (1120).

The first refractive surface (1110) is extended to the rear surface (1220). The refractive surface (1110) may be bent from the rear surface (1220) to be extended to a lateral upper direction. Furthermore, the first refractive surface (1110) may be extended from an upper surface of the driving substrate (1030) to a lateral upper direction.

The first refractive surface (1110) may be a curved surface. To be more specific, the first refractive surface (1110) may be spherical or aspherical. The first refractive surface (1110) may emit light from the light emitting diode (1020). Furthermore, the first refractive surface (1110) may refract the light reflected from the reflective unit (1012). The first refractive surface (1110) may be extended to a lateral upper direction from outside of the depressed unit (1100). Furthermore, the first refractive surface (1110) may be curved from the rear surface (1220) to be extended to outside of the recess surface (1120).

The recess surface (1120) is an inner surface of the depressed unit (1100). The recess surface (1120) may reflect the light from the light emitting diode (1020) to a lateral direction, a lateral upper direction or to a lateral bottom direction, or emit the light by refracting the light. That is, the recess surface (1120) may be a total reflective surface or a light emitting surface.

The recess surface (1120) is extended from the OA of the light emitting diode (1020). To be more specific, the recess surface (1120) is extended to a direction distancing from the OA of the light emitting diode (1020). At this time, the direction distancing from the OA of the light emitting diode (1020) means a direction perpendicular to the OA of the light emitting diode (1020), or an outside direction inclining from the OA of the light emitting diode (1020). To be more specific, the recess surface (1120) is extended from the OA of the light emitting diode (1020) to the lateral upper direction. The recess surface (1120) is extended to the outside from the OA of the light emitting diode (1020). At this time, the term of 'OA' means an optical progressing direction from a point light source to a center of three-dimensionally emitted luminous flux.

Furthermore, the OA of the light emitting diode (1020) may pass a center of the incident surface (1210) and a center of the refractive surfaces (1110, 1120). That is, the OA of the light emitting diode (1020) may be substantially same as an OA of the luminous flux control member (1010). The OA of the light emitting diode (1020) may substantially correspond to a center axis of the luminous flux control member (1010), where the center axis may be a center of the incident surface (1210), or a straight line passing the center of the refractive surfaces (1110, 1210).

At this time, the term of 'curvature' means a slowly bending phenomenon. By way of non-limiting example, in a case two surfaces form a curved surface with a curvature radius greater than approximately 0.1 mm and are bent, it can be said that two surfaces are curved. At this time, the term of 'inflection' means that inclination of curvature is changed to be bent. By way of non-limiting example, the inflection may be the case where a convex curvature is bent to change to a concave curvature, or a concave curvature is bent to change to a convex curvature.

The rear surface (1220) is extended from the incident surface (1210). The rear surface (1220) is arranged opposite to an upper surface of the driving substrate (1030). The rear surface (1220) may be directly brought into contact with the upper surface of the driving substrate (1030). The rear surface (1220) may be arranged directly opposite to the upper surface of the driving substrate (1030).

The rear surface (1220) may be a flat plane. Furthermore, the rear surface (1220) may encompass a surrounding of the incident surface (1210). That is, the rear surface (1220) may be extended along a surrounding of the light emitting diode (1020).

The refractive surface (1110) is formed at a lateral surface of the refractive unit (1011) which is transparent. A refractive index of the refractive unit (1011) may be approximately 1.4 to 1.5. The refractive unit (1011) may be formed with a transparent resin. To be more specific, the refractive unit (1011) may include silicon resin. An example of material used from the refractive unit (1011) may be PDMS (Polydimethylsiloxane).

The reflective unit (1012) is arranged inside the refractive unit (1011). The reflective unit (1012) may be partially or totally inserted into the refractive unit (1011). That is, a partial surface of the reflective unit (1012) may be exposed from the refractive unit (1011) to the outside. Alternatively, the surface of the reflective unit (1012) may be totally covered by the refractive unit (1011).

The refractive unit (1011) may cover approximately ⅗ to ⁹⁹⁄₁₀₀ of an outside surface of the reflective unit (1012). Furthermore, the refractive unit (1011) includes a contact surface (1130) directly contacted by the reflective unit (1012) because the refractive unit (1011) can cover a part or a total of the reflective unit (1012). The contact surface (1130) is a plane directly adjacent to the reflective unit (1012) at the refractive unit (1011). At this time, in a case the refractive unit (1011) partially covers the reflective unit (1012), the contact surface (1130) and the refractive surfaces (1110, 1210) may be bent. That is, the refractive surfaces (1110, 1210), i.e., the recess surface (1120), may be bent and extended from the contact surface (1130), for example.

The reflective unit (1012) may partially or totally reflect the light incident on the refractive unit (1011). The reflective unit (1012) may include a material having a high transmittance. The reflective unit (1012) may include a metal such as silver or aluminum. Alternatively, the reflective unit (1012) may include a material having a high refractivity. By way of non-limiting example, the reflective unit (1012) may be a member coated with a high refractive material such as a titanium dioxide ($TiO_2$).

The reflective unit (1012) may include a reflective surface (1310) reflecting light incident through the incident surface (1210). The reflective surface (1310) may be a plane directly contacting the refractive unit (1011) at the reflective unit (1012). The reflective surface (1310) may be a curved surface or a flat surface. The reflective surface (1310) may be a curved surface such as a spherical surface.

In a case each of the reflective units (1012, 1013) takes a shape of a horn or a frustum, as illustrated in FIGS. 9 and 10, a periphery and/or a bottom surface may be the reflective surface (1310).

Particularly, in a case each of the reflective units (1012, 1013) takes a shape of a horn or a frustum, the reflective unit (1012) may face the light emitting diode (1020). That is, in a case the reflective unit (1012) takes a shape of a horn, a vertex may face the incident surface (1210). Furthermore, a part of an upper surface of the reflective unit (1012) may be exposed from the refractive unit (1011). Furthermore, the other part of the upper surface of the reflective unit (1012) may be inserted into the refractive unit (1011).

The reflective unit (1012) may be arranged to correspond to the OA of the light emitting diode (1020). That is, the reflective unit (1012) may be arranged on the OA of the light emitting diode (1020). The reflective unit (1012) may be arranged adjacent to the OA of the light emitting diode (1020). An angle ($\theta_1$) between the OA of the light emitting diode (1020) and a tangent line between a center of the light emitting diode (1020) and an outside of the reflective unit (1012) may be approximately 0.1° to 10°. To be more specific, an angle ($\theta_1$) between the OA of the light emitting diode (1020) and a tangent line between a center of the light emitting diode (1020) and an outside of the reflective unit (1012) may be approximately 1° to 5°.

Furthermore, an angle ($\theta_2$) between the reflective surface (1310) of the reflective unit (1012) and the OA of the light emitting diode (1020) and a horizontal plane may be approximately 10° to 70°. That is, the reflective surface (1310) may be inclined relative to the horizontal plane.

As illustrated in FIG. 11, the reflective unit (1014) may take a shape of a particle. To be more specific, the reflective unit (1014) may take a shape of a sphere. Furthermore, as illustrated in FIG. 12, a part of reflective unit (1014) may take a shape of a partially-cut sphere. As a result, the reflective units (1014, 1015) may take a shape of a sphere.

The luminous flux control member (1010) may take an axially symmetrical shape relative to the OA of the light emitting diode (1020). That is, the luminous flux control member (1010) may symmetrically take the same shape based on a horizontal direction.

The luminous flux control member (1010) may take a plane symmetrical shape relative to a plane contacted by the OA of the light emitting diode (1020). That is, the luminous flux control member (1010) may take a shape extended to a direction perpendicular to the OA of the light emitting diode (1020). That is, the luminous flux control member (1010) may take a shape extended to one direction when viewed from a top side.

The luminous flux control member (1010) may be formed directly on the driving substrate (1030). Furthermore, the luminous flux control member (1010) may be formed directly on the light emitting diode (1020). The luminous flux control member (1010) may directly contact the driving substrate (1030) and the light emitting diode (1020). To be more specific, the luminous flux control member (1010) may be tightly brought into contact with the driving substrate (1030) and the light emitting diode (1020). The luminous flux control member (1010) may be formed in the following manner.

Referring to FIG. 13, a resin composition (1011) is arranged on the driving substrate (1030) mounted with the light emitting diode (1020). The resin composition may include a thermosetting resin, a thermoplastic resin, or a photo-polymeric resin.

Referring to FIG. 14, a mold (1001) accommodated therein with the reflective unit (1012) is provided. The reflective unit (1012) may be temporarily fixed inside a forming groove (1002) of the mold (1001). To be more specific, the reflective unit (1012) may be temporarily attached to an inner surface of the forming groove (1002) of the mold (1001). Furthermore, the forming groove (1002) may take a substantially same shape as that of refractive unit (1011).

Referring to FIG. 15, the mold (1001) accommodated with the reflective unit (1012) is pressed to the resin composition (1011). The resin composition (1011) is introduced into the forming groove (1002). Furthermore, the resin composition (1011) may cover a part or a total of the reflective unit (1012).

Thereafter, the resin composition (1011) is cooled or cured. That is, in a case the resin composition (1011) is a thermosetting resin, the resin composition (1011) is formed by the mold (1001) under a heated state and cooled. In a case the resin composition (1011) is a thermoplastic resin, or a photo-polymeric resin, the resin composition (1011) inside the mold (1001) is cured by light and/or heat, whereby the luminous flux control member (1010) is formed.

Thus, the luminous flux control member (1010) is so formed as to be tightly abutted to the driving substrate (1030) and the light emitting diode (1020). Thereafter, the mold (1001) is removed. Alternatively, the luminous flux control member (1010) may be separately formed and attached to the driving substrate (1030) by an adhesive or the like.

The light emitting diode (1020) generates light. The light emitting diode (1020) may be a point light source. The light emitting diode (1020) is electrically connected to the driving substrate (1030). The light emitting diode (1020) may be mounted on the driving substrate (1030). As a result, the light emitting diode (1020) receives an electrical signal from the driving substrate (1030). That is, the light emitting diode (1020) is driven by the driving substrate (1030) to thereby generate the light.

The driving substrate (1030) supports the light emitting diode (1020) and the luminous flux control member (1010). Furthermore, the driving substrate (1030) is electrically connected to the light emitting diode (1020). The driving substrate (1030) may be a PCB (Printed Circuit Board). Furthermore, the driving substrate (1030) may be rigid or flexible.

Although the present exemplary embodiment of the present invention has illustrated and explained one driving substrate (1030) arranged by one light emitting diode (1020) and one luminous flux control member (1010), the present invention is not limited thereto. By way of non-limiting example, one driving substrate (1030) may be arranged by a plurality of light emitting diodes (1020). Furthermore, each of the light emitting diodes (1020) may be correspondingly arranged by each of luminous flux control members (1010).

As explained before, the luminous flux control member (1010) according to the exemplary embodiment of the present invention is such that the reflective unit (1012) is inserted into the refractive unit (1011), whereby the luminous flux control member (1010) according to the exemplary embodiment of the present invention can adjust a shape of the reflective unit (1012) as desired. Particularly, as the luminous flux control member (1010) according to the exemplary embodiment of the present invention can be inserted into the refractive unit (1011), a reflective surface (0310) of the reflective unit (12) can be formed as desired regardless of shape or design of the refractive unit (1011).

Thus, the exemplary embodiment of the present invention can diffuse the incident light as desired using the luminous flux control member (1010). As a result, the luminous flux control member (1010) and the light emitting device according to the exemplary embodiment of the present invention can effectively control the luminous flux and accomplish the brightness uniformity.

Figure 16:
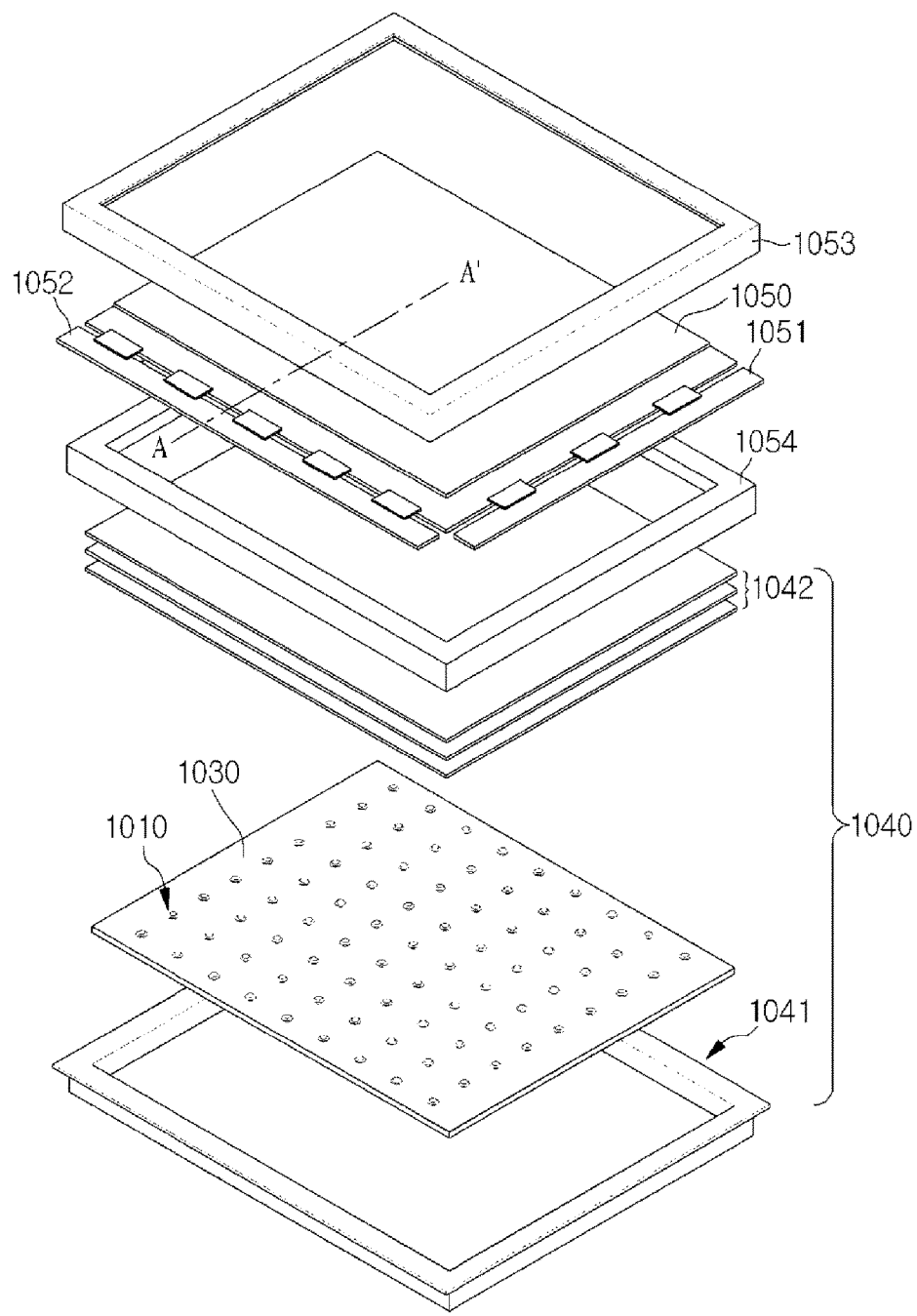
FIG. 16 is an exploded perspective view illustrating a liquid crystal display device according to an exemplary embodiment of the present invention.
Figure 17:
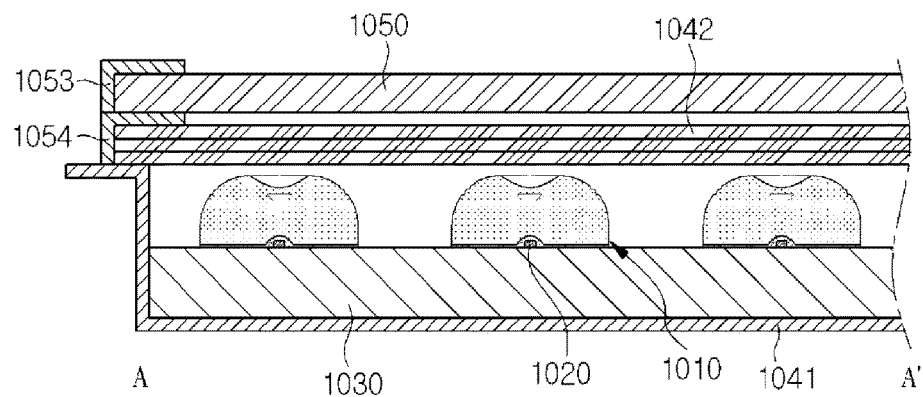
FIG. 17 is a cross-sectional view illustrating a cross-section taken along line A-A' of FIG. 16.

FIG. 16 is an exploded perspective view illustrating a liquid crystal display device according to an exemplary embodiment of the present invention, and FIG. 17 is a cross-sectional view illustrating a cross-section taken along line A-A' of FIG. 16. In the present exemplary embodiment, the aforementioned light emitting device is being used as reference. That is, explanation and illustration of the light emitting device according to the previous exemplary embodiments will be substantially combined with those of the present exemplary embodiment.

Referring to FIGS. 16 and 17, a liquid crystal display device according to the present exemplary embodiment includes a liquid crystal display panel (1050) and a backlight unit (1040). The liquid crystal display panel (1050) serves to display a picture data or an image.

Although not illustrated, the liquid crystal display panel (1050) includes, for coherence to maintain a uniform gap by facing each other, a TFT (Thin Film Transistor) substrate, a C/F (Color Filter) substrate and a liquid crystal layer interposed between the TFT substrate and the C/F substrate. The TFT substrate is structurally configured such that a plurality of gate lines is formed, a plurality of data lines crossing the plurality of data lines is formed and TFTs are formed at a crossing area between the gate lines and the data lines.

The liquid crystal display panel (1050) includes, at an edge thereof, a gate driving PCB (1051) supplying a scan signal to the gate line, and a data driving PCB supplying a data signal to the data line (1052). The gate and data driving PCBs (1051, 1052) are electrically connected to the liquid crystal display panel (1050) using a COF (Chip On Film), where the COF may be changed by a TCP (Tape Carrier Package).

Furthermore, the liquid crystal display device according to the present exemplary embodiment includes a panel guide (1054) supporting the liquid crystal display panel (1050) and a top case (1053) encompassing an edge of the liquid crystal display panel (1050) and coupled to the panel guide (1054).

The backlight unit (1040) is configured to be mounted on a large (20-inch or more) liquid crystal display device in a direct type method. The backlight unit (1040) includes a bottom cover (1041), a driving substrate (1030), a plurality of light emitting diodes (1020), a plurality of luminous flux control members (1010) and optical sheets (1042).

The bottom cover (1041) takes a shape of an upper surface-opened box to accommodate the driving substrate (1030). Furthermore, the bottom cover (1041) functions to support the optical sheets (1042) and the liquid crystal display panel (1050). The bottom cover (1041) may be formed using a metal and the like. By way of non-limiting example, the bottom cover (1041) may be formed by bending or curving a metal plate. That is, the driving substrate (1030) is accommodated at a space formed by the bending and curving the metal plate.

The driving substrate (1030) is arranged inside the bottom cover (1041). The driving substrate (1030) may be a driving substrate (1030). The driving substrate (1030) is electrically connected to the light emitting diodes (1020). That is, the light emitting diodes (1020) may be mounted on the driving substrate (1030). The driving substrate (1030) takes a shape of a plate. The driving substrate (1030) is electrically connected to the light emitting diodes (1020) and supplies a driving signal to the light emitting diodes (1020). The driving substrate (1030) may be coated at an upper surface with a reflective layer for enhancing performance of the backlight unit (1040). That is, the reflective layer can reflect the light emitted from the light emitting diodes (1020) to an upward direction.

The light emitting diodes (1020) generate light using an electrical signal applied through the driving substrate (1030). That is, the light emitting diodes (1020) are light sources. To be more specific, each of the light emitting diodes (1020) is a point light source, and each of the light emitting diodes is gathered to form a surface light source, where the light emitting diodes (1020) are a light emitting diode (1020) package including light emitting diode (1020) chips.

The light emitting diodes (1020) are mounted on the driving substrate (1030). The light emitting diodes (1020) may be arranged on the driving substrate (1030), each at a predetermined distance. The light emitting diodes (1020) may emit white light. Alternatively, the light emitting diodes (1020) may emit blue light, green light and red light on an even dividing manner.

The luminous flux control members (1010) respectively cover the light emitting diodes (1020). The light from the light emitting diodes (1020) is incident on the luminous flux control members (1010). The incident light now has a brightness uniformity enhanced by the luminous flux control members (1010) and is emitted upwards. the configuration and characteristics of the luminous flux control members (1010) may be substantially same as those of the previous exemplary embodiments.

The optical sheets (1042) improve the characteristics of passing light. The optical sheets (1042) may be polarizing sheets, prism sheets or diffusion sheets, for example.

As explained in the previous exemplary embodiments, the luminous flux control members (1010) can effectively diffuse the light emitted from the light emitting diodes (1020). As a result, the backlight unit (1040) can emit light having the enhanced brightness uniformity to the liquid crystal panel. Thus, the liquid crystal display device according to the present exemplary embodiment can have the enhanced brightness uniformity and enhanced picture quality.

What has been described above in terms of characteristics, structures and effects includes examples of one or more aspects. It is, of course, not possible to describe every conceivable combination of components or methodologies for purposes of describing the aforementioned aspects, but one of ordinary skill in the art may recognize that many further combinations and permutations of various aspects are possible. Accordingly, the described aspects are intended to embrace all such alterations, modifications, and variations that fall within the scope of the appended claims.

While the present invention has been described with respect to the above exemplary embodiments, the present invention is not so limited and should be understood to be merely exemplary. Various modifications to the invention will be readily apparent to those skilled in the art, and the generic principles defined herein may be applied to other variations without departing from the spirit or scope of the invention. For example, each constituent element explained in detail in the above exemplary embodiments may be implemented in other various modifications.

MODE FOR INVENTION

Experimental Example

Figure 19:
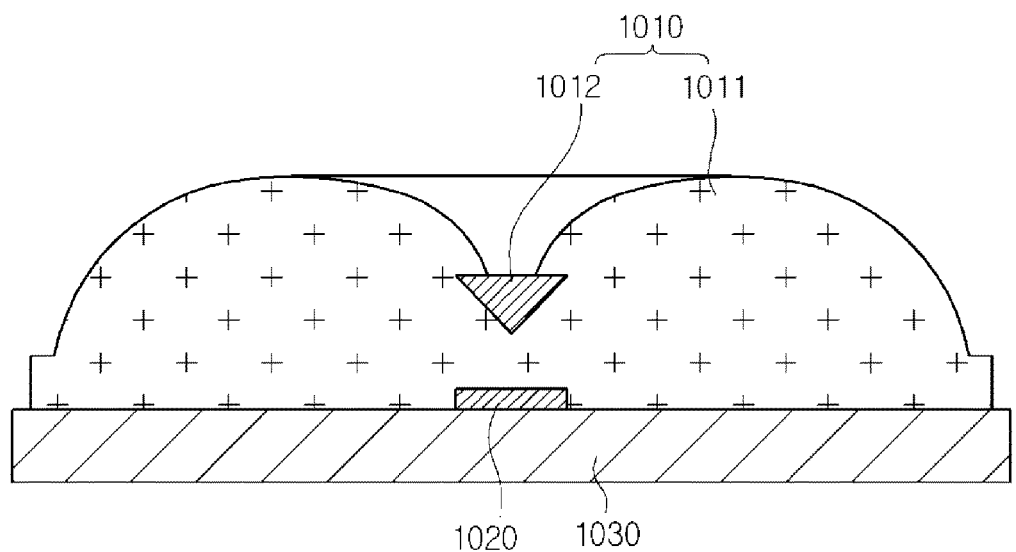
FIG. 19 is a cross-sectional view illustrating a light emitting device according to an experimental example.
Figure 21:
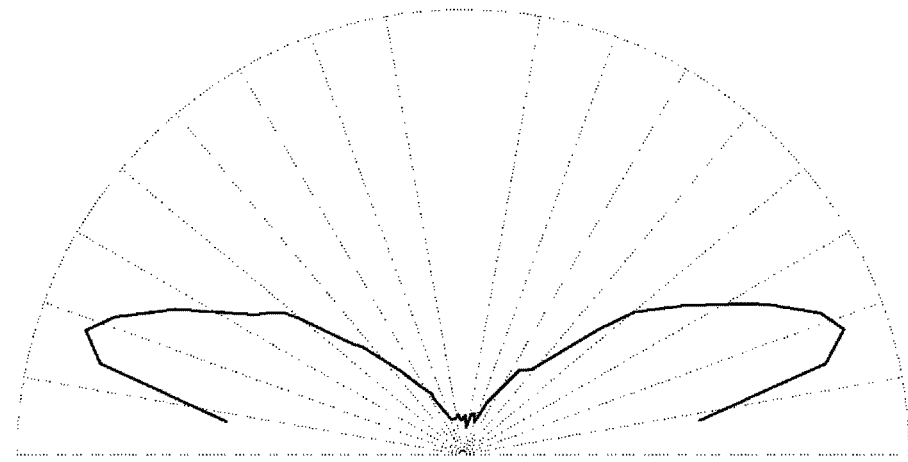
FIG. 21 is a schematic view illustrating a light distribution of a light emitting device according to an experimental example.

As illustrated in FIG. 19, a luminous flux control member (1010) is mounted. At this time, the luminous flux control member (1010) is substantially same in terms of shape as that of FIG. 13. Furthermore, the luminous flux control member (1010) includes a reflective unit (1011) of frustum shape. The reflective unit (1011) was partially inserted into a refractive unit (1012). At this time, an apex of the reflective unit (1011) was so arranged as to match to an optical axis of a light emitting diode (1020). Light was incident on the light emitting diode (1020), and brightness distribution of light emitted from the luminous flux control member (1010) was measured as shown in FIG. 21.

Comparative Example

Figure 18:
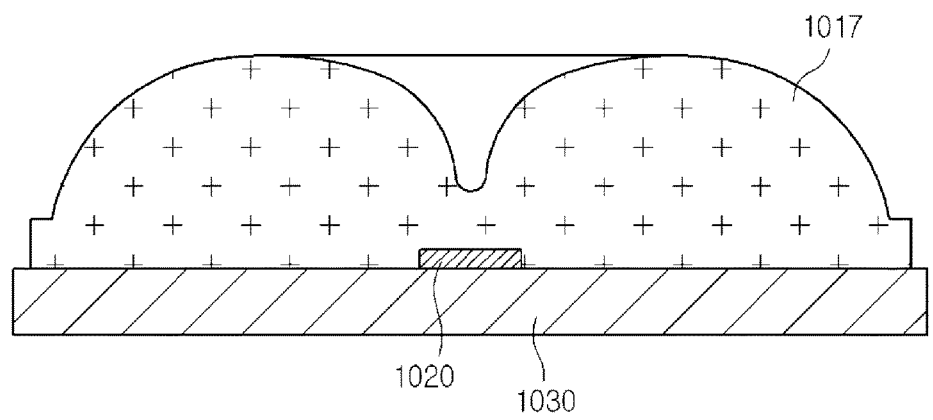
FIG. 18 is a cross-sectional view illustrating a light emitting device according to a comparative example.

As illustrated in FIG. 18, a luminous flux control member (1017) is mounted. At this time, the luminous flux control member (1017) according to the comparative example is substantially same in terms of shape as the luminous flux control member (1010) in the experimental example. At this time, light was incident on a light emitting diode (1020), and brightness distribution of light emitted from the luminous flux control member (1017) was measured as shown in FIG. 20.

Result

Figure 20:
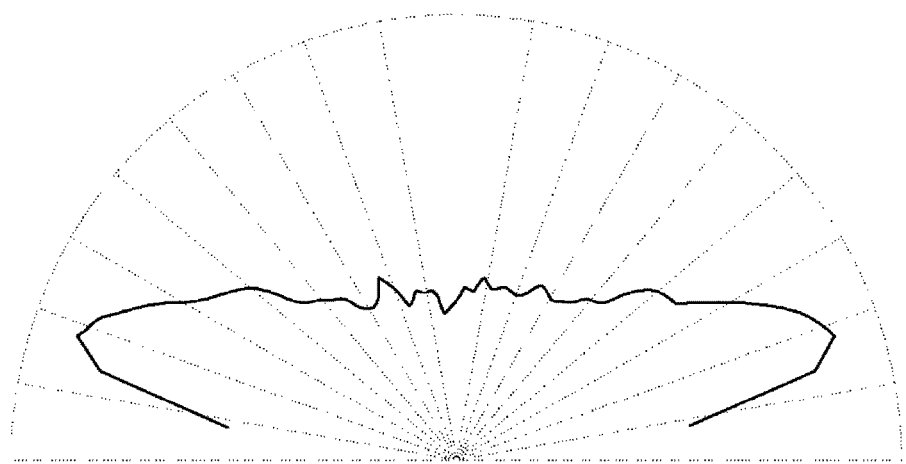
FIG. 20 is a schematic view illustrating a light distribution of a light emitting device according to a comparative example.

As shown in FIGS. 20 and 21, it could be noted that, in case of the experimental example, the light from the light emitting diode was effectively dispersed to a lateral side by the luminous flux control member.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The exemplary embodiments of the present invention has an industrial applicability in that brightness uniformity can be enhanced by allowing a luminous flux control member of a light emitting device to radiate light more evenly toward a display panel.

The invention claimed is:

1. A member for controlling luminous flux, the member comprising:
   a refractive unit having a half-torus shape; and
   a reflective unit partially or totally inserted into the refractive unit, wherein the refractive unit includes:
      an incident surface receiving light from a light source;
      a contact surface directly brought into contact with the reflective unit; and
      a refractive surface extended from the contact surface, wherein the reflective unit is arranged opposite to the incident surface, and wherein a width of the reflective unit is equal to or less than a width of the light source.

2. The member for controlling luminous flux of claim 1, wherein the reflective unit includes a reflective surface reflecting the light from the incident surface.

3. The member for controlling luminous flux of claim 2, wherein the reflective surface includes a curved surface.

4. The member for controlling luminous flux of claim 1, wherein the reflective unit includes a spherical surface.

5. The member for controlling luminous flux of claim 1, wherein the reflective unit takes a shape of a horn or a frustum.

6. The member for controlling luminous flux of claim 5, wherein the reflective unit faces the incident surface.

7. The member for controlling luminous flux of claim 1, wherein the reflective unit takes a shape of a sphere.

8. The member for controlling luminous flux of claim 1, wherein the refractive unit covers $3/5$ to $99/100$ of an outside surface of the reflective unit.

9. The member for controlling luminous flux of claim 1, wherein a portion of a top surface of the reflective unit is exposed outward from the refractive unit.

10. A display device, the device comprising:
    a light source;
    a luminous flux control member receiving light from the light source; and
    a display panel receiving light from the luminous flux control member, wherein the luminous flux control member includes:
       a refractive unit having a half-torus shape and configured to receive the light from the light source; and
       a reflective unit partially or totally inserted into the refractive unit to reflect the light from the light source, wherein the reflective unit faces an incident surface of the refractive unit, and wherein the refractive unit includes an incident surface receiving light, a contact surface directly brought into contact with the reflective unit, and a refractive surface extended from the contact surface, and wherein a width of the reflective unit is equal to or less than a width of the light source.

11. The display device of claim 10, wherein the reflective unit is arranged on an optical axis of the light source.

12. The display device of claim 10, further comprising a driving substrate electrically connected to the light source, and the luminous flux control member is brought into close contact with the light source and the driving substrate.

13. The display device of claim 10, wherein the reflective unit takes a shape of a particle.

14. A method for fabricating the luminous flux control member of claim 10, the method comprising:
    arranging the reflective unit inside a mold; and
    arranging a transparent resin inside the mold to partially or totally cover the reflective unit, wherein the reflective unit is temporarily fixed inside the mold.

15. The method of claim 14, further comprising providing a driving substrate and a light source arranged on the driving substrate, wherein the transparent resin is brought into close contact with the driving substrate and the light source.

* * * * *